US009165853B2

(12) United States Patent
Wang et al.

(10) Patent No.: US 9,165,853 B2
(45) Date of Patent: Oct. 20, 2015

(54) CLOSED LOOP TEMPERATURE CONTROLLED CIRCUIT TO IMPROVE DEVICE STABILITY

(71) Applicants: STMICROELECTRONICS ASIA PACIFIC PTE LTD, Singapore (SG); STMICROELECTRONICS, INC., Coppell, TX (US)

(72) Inventors: Fuchao Wang, Plano, TX (US); Olivier Leneel, Singapore (SG); Ravi Shankar, Singapore (SG)

(73) Assignees: STMicroelectronics Asia Pacific Pte. Ltd., Singapore (SG); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/586,231

(22) Filed: Dec. 30, 2014

(65) Prior Publication Data

US 2015/0108105 A1 Apr. 23, 2015

Related U.S. Application Data

(62) Division of application No. 12/902,005, filed on Oct. 11, 2010, now Pat. No. 8,927,909.

(51) Int. Cl.
*H05B 1/02* (2006.01)
*H01L 23/34* (2006.01)
*H05B 3/12* (2006.01)
(Continued)

(52) U.S. Cl.
CPC ............ *H01L 23/345* (2013.01); *H05B 1/0227* (2013.01); *H05B 3/02* (2013.01); *H05B 3/12* (2013.01); *H05B 3/34* (2013.01)

(58) Field of Classification Search
CPC .......... H05B 3/12; H05B 1/0227; H05B 3/34; H05B 1/02; H01L 23/345
USPC ................. 219/481, 494, 497, 501, 209, 210; 327/513; 324/762.03, 762.02, 762.06
See application file for complete search history.

(56) References Cited

U.S. PATENT DOCUMENTS 3,289,046 A 11/1966 Carr
3,416,959 A 12/1968 Cormia
(Continued)

FOREIGN PATENT DOCUMENTS

JP 61100956 A 5/1986
WO 2005/093868 A1 10/2005

OTHER PUBLICATIONS

Colgan et al., "Phase formation in Cr-Si thin-film interactions," *Appl. Phys. Lett.* 37(10): 938-940, Nov. 15, 1980.

(Continued)

*Primary Examiner* — Mark Paschall
(74) *Attorney, Agent, or Firm* — Seed IP Law Group PLLC

(57) ABSTRACT

An integrated circuit is provided having an active circuit. A heating element is adjacent to the active circuit and configured to heat the active circuit. A temperature sensor is also adjacent to the active circuit and configured to measure a temperature of the active circuit. A temperature controller is coupled to the active circuit and configured to receive a temperature signal from the temperature sensor. The temperature controller operates the heating element to heat the active circuit to maintain the temperature of the active circuit in a selected temperature range.

20 Claims, 20 Drawing Sheets

(51) Int. Cl.
*H05B 3/34* (2006.01)
*H05B 3/02* (2006.01)

(56) References Cited

U.S. PATENT DOCUMENTS

| | | | |
|---|---|---|---|
| 4,104,607 A | 8/1978 | Jones | |
| 4,125,854 A | 11/1978 | McKenny et al. | |
| 4,356,379 A * | 10/1982 | Graeme | 219/209 |
| 4,392,992 A | 7/1983 | Paulson et al. | |
| 4,497,998 A | 2/1985 | West | |
| 4,746,896 A | 5/1988 | Mcquaid et al. | |
| 4,752,814 A | 6/1988 | Tuan | |
| 4,766,411 A | 8/1988 | Prieto et al. | |
| 4,876,668 A | 10/1989 | Thakoor et al. | |
| 5,037,766 A | 8/1991 | Wang | |
| 5,041,800 A | 8/1991 | Long et al. | |
| 5,135,888 A | 8/1992 | Chan et al. | |
| 5,152,869 A | 10/1992 | Ferraris et al. | |
| 5,268,651 A | 12/1993 | Kerth | |
| 5,468,672 A | 11/1995 | Rosvold | |
| 5,485,138 A | 1/1996 | Morris | |
| 5,494,845 A | 2/1996 | Sereda et al. | |
| 5,503,878 A | 4/1996 | Suzuki et al. | |
| 5,623,097 A | 4/1997 | Horiguchi et al. | |
| 5,635,893 A | 6/1997 | Spraggins et al. | |
| 5,640,023 A | 6/1997 | Balasinski et al. | |
| 5,656,524 A | 8/1997 | Eklund et al. | |
| 5,821,960 A | 10/1998 | Mitani | |
| 5,844,208 A | 12/1998 | Tustaniwskyj et al. | |
| 6,211,032 B1 | 4/2001 | Redford et al. | |
| 6,274,452 B1 | 8/2001 | Miura et al. | |
| 6,281,090 B1 | 8/2001 | Kukanskis et al. | |
| 6,324,093 B1 | 11/2001 | Perner et al. | |
| 6,426,268 B1 | 7/2002 | Huppert et al. | |
| 6,466,124 B1 | 10/2002 | Shibuya et al. | |
| 6,504,226 B1 | 1/2003 | Bryant | |
| 6,798,706 B2 | 9/2004 | Barth et al. | |
| 6,809,379 B2 | 10/2004 | Kreupl | |
| 6,815,643 B2 * | 11/2004 | Der Ropp | 219/209 |
| 6,873,543 B2 | 3/2005 | Smith et al. | |
| 6,876,250 B2 | 4/2005 | Hsu et al. | |
| 6,890,810 B2 | 5/2005 | Amadon et al. | |
| 6,891,747 B2 | 5/2005 | Bez et al. | |
| 7,009,208 B2 | 3/2006 | Aratani et al. | |
| 7,213,327 B2 | 5/2007 | Su et al. | |
| 7,259,040 B2 | 8/2007 | Pellizer et al. | |
| 7,338,637 B2 | 3/2008 | Pease et al. | |
| 7,381,981 B2 | 6/2008 | Aitken et al. | |
| 7,410,246 B2 | 8/2008 | Bell et al. | |
| 7,410,879 B1 | 8/2008 | Hill et al. | |
| 7,411,818 B1 | 8/2008 | Elmegreen et al. | |
| 7,416,951 B2 | 8/2008 | Beach et al. | |
| 7,425,724 B2 | 9/2008 | Aratani et al. | |
| 7,427,926 B2 | 9/2008 | Sinclair et al. | |
| 7,553,002 B2 | 6/2009 | Baek | |
| 7,605,079 B2 | 10/2009 | Lai et al. | |
| 7,633,079 B2 | 12/2009 | Chen et al. | |
| 7,635,998 B1 | 12/2009 | Taki | |
| 7,652,279 B2 | 1/2010 | Krusin-Elbaum et al. | |
| 7,724,562 B2 | 5/2010 | Meyer et al. | |
| 7,724,564 B2 | 5/2010 | Taylor et al. | |
| 7,787,282 B2 | 8/2010 | Ramani et al. | |
| 7,820,996 B2 | 10/2010 | Lee et al. | |
| 7,838,875 B1 | 11/2010 | Tsang | |
| 7,862,233 B2 | 1/2011 | Hyde et al. | |
| 7,863,598 B2 | 1/2011 | Sugita et al. | |
| 7,883,930 B2 | 2/2011 | Tsukamoto et al. | |
| 7,969,806 B2 | 6/2011 | De Ambroggi et al. | |
| 7,978,540 B2 | 7/2011 | Bardouillet et al. | |
| 8,000,127 B2 | 8/2011 | Hamilton et al. | |
| 8,093,535 B2 | 1/2012 | Heismann et al. | |
| 8,129,706 B2 | 3/2012 | Ho et al. | |
| 8,169,811 B2 | 5/2012 | Li et al. | |
| 8,169,819 B2 | 5/2012 | Shima et al. | |
| 8,174,877 B2 | 5/2012 | Baks | |
| 8,208,294 B2 | 6/2012 | Happ et al. | |
| 8,212,184 B2 | 7/2012 | Mowry et al. | |
| 8,242,497 B2 | 8/2012 | Tsang | |
| 8,242,876 B2 | 8/2012 | Le Neel et al. | |
| 8,334,525 B2 | 12/2012 | Nakai et al. | |
| 8,384,395 B2 * | 2/2013 | Karnad et al. | 324/555 |
| 8,436,426 B2 | 5/2013 | Le Neel | |
| 8,488,359 B2 | 7/2013 | Chung | |
| 8,493,171 B2 | 7/2013 | Le Neel et al. | |
| 8,526,214 B2 | 9/2013 | Le Neel | |
| 2003/0150101 A1 | 8/2003 | Park et al. | |
| 2003/0155591 A1 | 8/2003 | Kreupl | |
| 2004/0021740 A1 | 2/2004 | Bell et al. | |
| 2005/0052498 A1 | 3/2005 | Delametter et al. | |
| 2005/0200376 A1 * | 9/2005 | Yee et al. | 324/765 |
| 2006/0027892 A1 | 2/2006 | Yamashita et al. | |
| 2006/0054953 A1 | 3/2006 | Son et al. | |
| 2006/0224753 A1 | 10/2006 | Hama et al. | |
| 2007/0170546 A1 | 7/2007 | Beach | |
| 2007/0189053 A1 | 8/2007 | Pellizzer et al. | |
| 2008/0048242 A1 | 2/2008 | Choi et al. | |
| 2008/0217740 A1 | 9/2008 | Shiramizu et al. | |
| 2010/0073122 A1 | 3/2010 | Le Neel et al. | |
| 2010/0164520 A1 * | 7/2010 | Kiyofuji et al. | 324/754 |
| 2012/0049323 A1 | 3/2012 | Ng et al. | |
| 2012/0049324 A1 | 3/2012 | Le Neel et al. | |
| 2012/0049997 A1 | 3/2012 | Lim et al. | |
| 2012/0168754 A1 | 7/2012 | Le Neel et al. | |
| 2012/0170352 A1 | 7/2012 | Le Neel et al. | |

OTHER PUBLICATIONS

European Search Report, European U.S. Pat. No. 1119550, Mar. 20, 2012, 10 pages.
Extended European Search Report, dated Jul. 27, 2012, for European Application No. 11178590.3, 11 pages.
Galatsis et al., "p- and n-type Fe-doped $SnO_2$ gas sensors fabricated by the mechanochemical processing technique," *Sensors and Actuators B* 93: 562-565, 2003.
Hieber et al., "Structural and Electrical Properties of $CrSi_2$ Thin Film Resistors," *Thin Solid Films* 36: 357-360, 1976.
Hwang et al., "A novel structured polysilicon thin-film transistor that increases the on/off current ratio," *Semicond. Sci. Technol.* 18: 845-849, 2003.
Le Neel, "Resistor Thin Film MTP Memory," U.S. Appl. No. 13/953,626, Notice of Allowance mailed Sep. 26, 2013, 17 pages.
Le Neel, "Resistor Thin Film MTP Memory," U.S. Appl. No. 13/953,626, Notice to File Corrected Application Papers Mailed Dec. 6, 2013 and Response filed Dec. 11, 2013, 6 pages.
Le Neel, "Resistor Thin Film MTP Memory," U.S. Appl. No. 13/953,626, filed Jul. 29, 2013, 88 pages.
Nishida et al., "A New Self-Aligned A-Si TFT Using Ion Doping and Chromium Silicide Formation," *Mat. Res. Soc. Symp. Proc.* 219: 303-308, 1991.
Nishida et al., "Semiconducting Properties of Pure and Mn-Doped Chromium Disilicides," *J. Phys. Chem. Solids.* 39: 499-505, 1978.
Privitera et al., "Morphological and electrical characterization of $Si_xCr_yC_zB_v$ thin films," *Microelectronic Engineering* 87: 430-433, 2010.
Sukhawuttichai et al., "Effect of $Bi_2O_3$ Addition on the Microstructure and Properties of the $SnO_2$ Varistor System," *33rd Congress on Science and Technology of Thailand*, Walailak University, Nakhon Si Thammarat, Thailand, Oct. 18-20, 2007, pp. 1-4.
Tuite, "Resistor Trimming," Retrieved Jan. 10, 2011 from http://electronicdesign.com/print/power/resistor-trimming17261.aspx, 2 pages.
Yamauchi et al., "Polysilicon Thin-Film Transistors with Channel Length and Width Comparable to or Smaller than the Grain Size of the Thin Film," *IEEE Transactions on Electron Devices* 38(1): 55-60, 1991.

* cited by examiner

CLOSED LOOP TEMPERATURE CONTROLLED CIRCUIT TO IMPROVE DEVICE STABILITY

BACKGROUND

1. Technical Field

The present disclosure relates to integrated circuits. The present disclosure relates in particular to the field of temperature control of an integrated circuit.

2. Description of the Related Art

Integrated circuits are used to perform many functions and are found in nearly all electronic devices. Integrated circuits are typically formed within and on semiconductor substrates. The physical properties of the semiconductor substrate affect the functionality of the integrated circuit. The physical properties of the semiconductor substrate are in turn affected by the temperature of the semiconductor surface.

Integrated circuits generally comprise numerous transistors formed near the surface of a semiconductor substrate. To form transistors the semiconductor substrate is doped at selected areas with donor and acceptor impurity atoms to alter the conductivity of the semiconductor and to provide the desired carrier type. The electron (a negative charge) is the majority carrier in a semiconductor doped with donor atoms. The hole (a positive charge) is the majority carrier in a semiconductor doped with acceptor atoms. The current and voltage characteristics of a transistor depend in part on the effective mobility of the charge carriers.

The physical properties of doped and undoped semiconductor materials are temperature dependent. The mobility of charge carriers in a semiconductor lattice varies with temperature. The conductivity of undoped silicon also depends on temperature. The conductive characteristics of the transistor are heavily dependent on temperature. The switching speed and performance of the transistors are in turn affected by the conductive characteristics of the transistor. The output characteristics of an integrated circuit containing millions or even billions of transistors can be greatly affected by temperature.

Integrated circuits generally comprise many other kinds of circuit elements whose characteristics are also dependent on the temperature. Integrated circuits are formed of many interconnecting metal lines formed within a multilevel dielectric stack. The physical characteristics of the metal lines and the layers of the dielectric stack also depend on temperature. The temperature dependence of all of these components of an integrated circuit makes the output characteristics of the integrated circuit dependent on temperature.

Many factors affect the temperature of an integrated circuit. The very use of an integrated circuit will change its temperature. As an integrated circuit is used, the large amounts of current flowing through the many circuit elements cause the temperature of the integrated circuit to increase. The heat generated by the integrated circuit increases and decreases as the demand on the integrated circuit increases and decreases. Thus an integrated circuit can undergo large changes in temperature based solely on its own performance requirements from moment to moment.

The temperature of the environment in which the integrated circuit is placed can also have a great effect on the temperature of the integrated circuit, particularly in very cold climates. For instance, a user of an electronic device in a very cold location may use the device outside and then bring the device indoors and cause the device to undergo a large change in temperature due to the large change in ambient temperature. These large changes in temperature affect the performance of the integrated circuit.

BRIEF SUMMARY

An integrated circuit is generally operable over a large range of temperatures. Performance characteristics may vary largely over the range of temperatures in which the circuit can operate. Some applications may call for particularly steady output characteristics. In such applications it may be desirable to maintain the temperature of the integrated circuit in a selected temperature range while the circuit is operating. In some applications it may be desirable to maintain the temperature of the integrated circuit in a selected temperature only during certain portions of operation that call for more steady output. Some applications may call for very small fluctuations in output characteristics. In these applications the temperature range may be selected to be very small according to the output specifications.

An integrated circuit may be heated to maintain the integrated circuit in a selected temperature range. If the integrated circuit is kept in this smaller temperature range the output characteristics of the integrated circuit will remain much steadier.

One embodiment is an integrated circuit comprising a semiconductor substrate having an active circuit in an active region of the semiconductor substrate. A temperature sensor is coupled to the active circuit. The temperature sensor is configured to measure a temperature of the active circuit. A heating element is coupled to the active circuit and configured to heat the active circuit. A temperature controller is coupled to the temperature sensor and the heating element. The temperature controller is configured to receive temperature data from the temperature sensor and to operate the heating element to maintain the temperature of the integrated circuit above a selected temperature.

In one embodiment the heating element is a thin film heating element. The heating element may be, for example, a TaAl thin film heating element.

In one embodiment the heating element is located in a multilevel dielectric stack of the integrated circuit. In one embodiment the heating element is located above the active circuit.

In one embodiment the temperature sensor is a bandgap temperature sensor. In one embodiment the bandgap temperature sensor is in the active region.

One embodiment is a method comprising measuring a temperature of an of an integrated circuit, sending temperature data to a temperature controller in the integrated circuit, and activating a heating element to heat the integrated circuit above a selected temperature. The temperature of the integrated circuit is then maintained above a selected minimum temperature.

In one embodiment the temperature of the integrated circuit is maintained in a selected temperature range.

One embodiment comprises sending a current through a thin film heating element to heat the integrated circuit.

One embodiment comprises varying a magnitude of the current according to the temperature data to maintain the temperature in the selected temperature range.

One embodiment is a device comprising a semiconductor die having an active region. A dielectric stack is located above the semiconductor die. A temperature sensor is in the active region and is configured to measure the temperature of the active circuit. A thin film heater is located in the dielectric stack. A temperature controller is in the active region and is configured to receive temperature data from the temperature sensor and to operate the thin film heater according to the temperature data to maintain the temperature of the active circuit in a selected temperature range.

In one embodiment the temperature controller regulates a current in the thin film heater to generate heat to maintain the temperature of the active circuit in the selected range.

One embodiment is a portable electronic device comprising a battery, an antenna coupled to the battery, and an integrated circuit coupled to the antenna and the battery. The integrated circuit includes a semiconductor die, a dielectric stack on a surface of the semiconductor die, an active circuit in the semiconductor die, a temperature sensor in the semiconductor die, a thin film heater in the dielectric stack, and a temperature controller coupled to the temperature sensor and the thin film heater. The temperature sensor is configured to measure a temperature of the active circuit. The thin film heater is configured to heat the active circuit. The temperature controller is configured to receive a temperature signal from the temperature sensor and to control the thin film heater to maintain the temperature of the active circuit in a selected temperature range.

In one embodiment the active circuit is on a first semiconductor die and the heating element is located on a second semiconductor die coupled to the first semiconductor die.

In one embodiment the temperature sensor is located on the second semiconductor die. Alternatively, the temperature sensor may be located on the first semiconductor die.

In one embodiment the temperature controller is located on the second semiconductor die. Alternatively the temperature controller may be located on the first semiconductor die.

DETAILED DESCRIPTION

Figure 1:
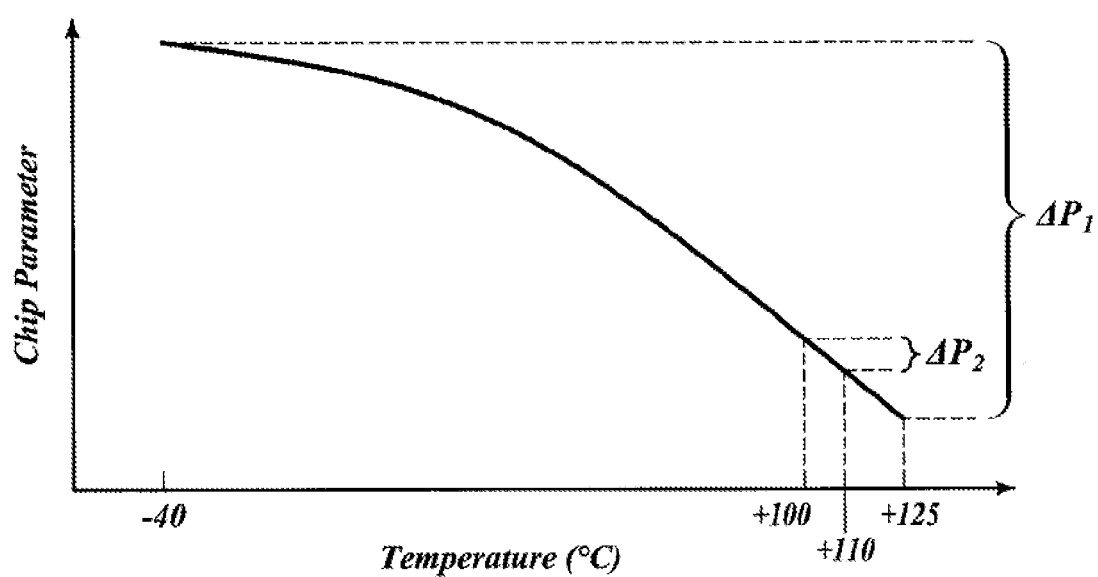
FIG. 1 is a curve of an output parameter of an integrated circuit vs. the temperature of the integrated circuit.

FIG. 1 shows a curve of an output characteristic of an active circuit of an integrated circuit vs. the temperature of the active circuit. The output characteristic is for example an output voltage, an output current, switching speed, a signal strength at a given frequency or any other characteristic that may vary with temperature in any manner. The curve of FIG. 1 illustrates the effect a large range in temperature can have on the output of an integrated circuit. Here the characteristic varies inversely with temperature. Over the entire range of temperature there is a large change $\Delta P1$ in the output characteristic. This can be problematic for systems which call for steady or even tightly controlled output characteristics from an integrated circuit. However, over the smaller range of temperatures between 100° C. and 110° C. there is a much smaller change $\Delta P2$ in the output characteristic. Thus maintaining the temperature of the active circuit in a relatively small range will allow for more steady output characteristics.

Figure 2:
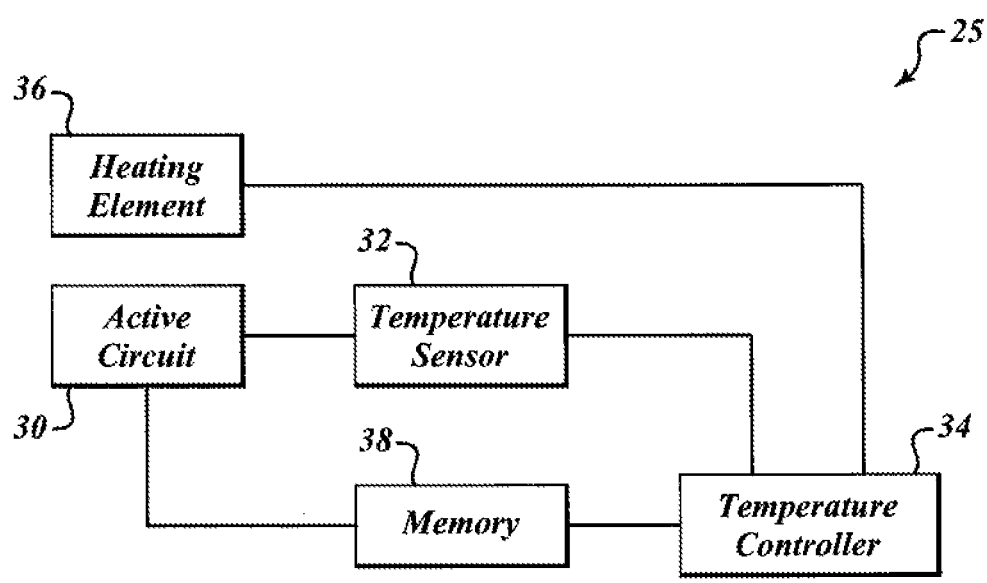
FIG. 2 is a block diagram of a system for maintaining a stable temperature of an active circuit according to one embodiment.

FIG. 2 illustrates a block diagram of a system 25 according to one embodiment. A temperature sensor 32 is positioned adjacent to an active circuit 30 of an integrated circuit. For the purpose of this disclosure and in the claims, "adjacent" means "near", "close to", or otherwise in physical proximity sufficient to perform a given function relating to another component or structure. The temperature sensor 32 is positioned such that the temperature of the active circuit 30 can either be ascertained directly or extrapolated from a parameter of the temperature sensor 32. The temperature sensor 32 is coupled to a temperature controller 34. The temperature sensor 32 communicates a temperature signal to the temperature controller 34. The temperature signal is representative of the temperature of the active circuit 30. The temperature controller 34 is coupled to a heating element 36. The heating element 36 generates and provides heat to the active circuit 30. The temperature controller 34 controls the function of the heating element 36. The temperature controller 34 activates the heating element 36 and controls a level of heat generated by the heating element 36 to maintain a temperature of the active circuit 30 above a selected minimum temperature. The temperature controller controls the heating element to generate more heat at times when the temperature of the active circuit risks falling below the minimum temperature of the temperature range and generates less heat at times when the temperature is at less risk of falling below the selected minimum temperature.

Some systems and applications are such that they call for particularly steady output characteristics during operation of the active circuit 30 or during certain portions of operation of the active circuit 30. In these cases the temperature controller 34 controls the temperature of the active circuit 30 above a selected minimum temperature and below a selected maximum temperature. In other words, the temperature controller ensures that the temperature of the active circuit 30 remains in a particular temperature range. The size of the temperature range determines the potential variation in output characteristics. The smaller the range of temperatures over which the active circuit 30 operates, the steadier the output characteristics will be. Applications that call for very steady output characteristics can be operated in a particularly tight temperature range. In these applications the temperature controller 34 controls the heating element 36 to generate more heat when the active circuit 30 risks falling below the minimum temperature of the selected temperature range or to generate less heat when the active circuit 30 risks surpassing the maximum temperature of the selected temperature range.

As discussed above, the active circuit 30 is itself a source of heat that alters the temperature of the active circuit 30. As demand on the active circuit 30 increases, so does the heat generated by the active circuit 30, and the temperature of the active circuit 30 rises. The amount of heat generated by the active circuit 30 decreases as demand on the active circuit 30 decreases. This increase and decrease in heat generated by the active circuit 30 due to the variable level of functioning of the active circuit 30 also affects the temperature of the active circuit 30.

In one embodiment the minimum temperature of the selected temperature range is chosen to be a temperature at which the active circuit 30 would by itself operate when in a state of relatively high demand. The heating element 36 is utilized to maintain the temperature of the active circuit 30 above this minimum temperature. In this way the temperature of the active circuit will not surpass the temperature range simply by operating in a common state of high demand. Of course in other embodiments the temperature range may be selected to coincide with a temperature range in which the active circuit would by itself operate when in a state of low or moderate demand.

In one embodiment the temperature controller 34 takes into account the momentary demand on the active circuit 30 when determining the desired heat output of the heating element 36. When the demand on the active circuit 30 is low, the temperature controller 34 controls the heating element 36 to generate more heat to maintain the temperature of the active circuit above the minimum temperature. When demand on the active circuit 30 is high, the temperature controller 34 controls the heating element 36 to generate less heat in order to maintain the temperature of the active circuit 30 below the maximum temperature of the selected temperature range.

The temperature sensor 32, the temperature controller 34, and the heating element 36 can thus be utilized to maintain the temperature of the active circuit 30 in a selected temperature range. The temperature sensor 32 continually or periodically measures the temperature of the active circuit 30 and communicates a temperature signal to the temperature controller 34. The temperature controller 34 calculates a level of heat to output from the heating element 36 to maintain the desired temperature of the active circuit 30. The temperature controller 34 then controls the level of heat output of the integrated circuit. The temperature controller 34 adjusts the heat output of the heating element 36 based on the temperature signal from the temperature sensor 32.

In one embodiment, the temperature controller 34 is coupled to the active circuit 30 so as to receive data from the active circuit 30 regarding a level of function of the active circuit 30. The temperature controller 34 can then use the temperature signal and the data regarding the level of function of the active circuit 30 to calculate the heat to output from the heating element 36 to maintain the temperature of the active circuit 30 in the desired temperature range.

In one embodiment the temperature controller 34 makes calculations by referencing a database stored in a physical memory 38 coupled to the temperature controller 34. The memory 38 stores data relating to the level of function of the active circuit 30, the heat output of the heating element 36, and the temperature of the active circuit 30. The temperature controller 34 is configured to write data to the memory 38 based on new temperature measurements. The memory 38 is in the form of EEPROM, Flash memory, magnetic hard drive, or any other suitable memory from which the temperature controller 34 or other circuit components may read and/or write data.

Figure 3:
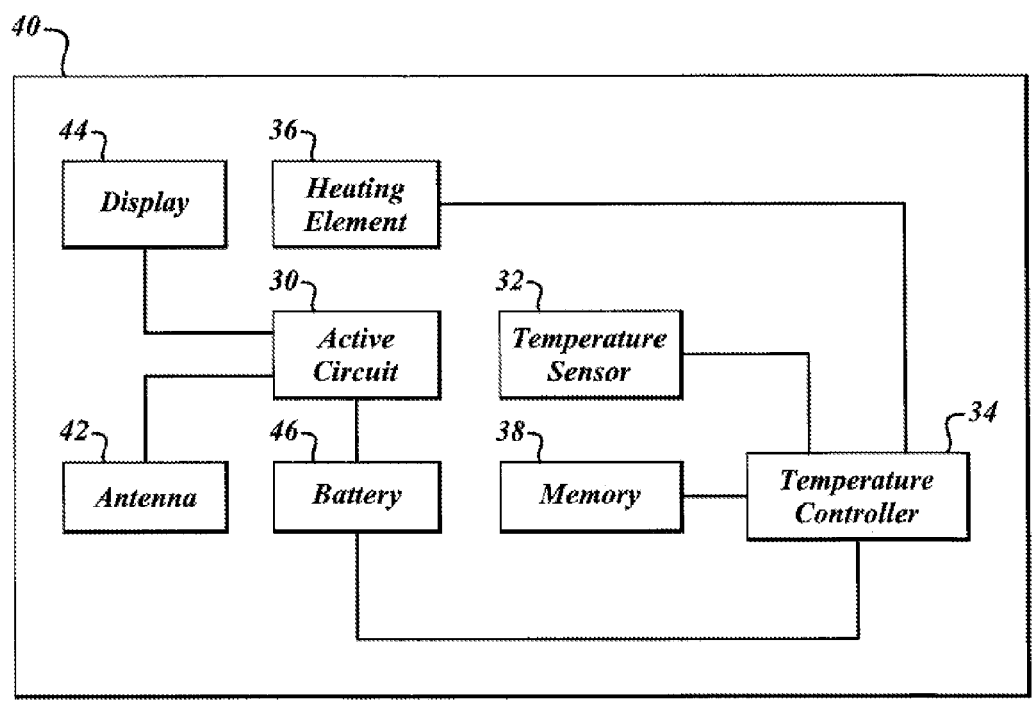
FIG. 3 is a block diagram of a portable electronic device for maintaining a stable temperature of an active circuit according to one embodiment.

FIG. 3 shows a block diagram of a wireless electronic device 40 according to one embodiment. The wireless electronic device 40 is for example a cell phone, a PDA, an MP3 player, a laptop, or other wireless device.

The wireless electronic device shows an active circuit 30, a temperature sensor 32, a temperature controller 34, a memory 38, and a heating element 36 as shown in FIG. 2. FIG. 3 additionally illustrates an antenna circuit 42 and a display coupled to the active circuit 30. A battery is coupled to the active circuit 30 and the temperature controller 34. In practice there are many more components in such devices than are illustrated in FIG. 3.

In extremely cold climates many electronic communication devices function poorly or not at all. In some cases the display fails to function, active circuit 30 fails to turn on, or active circuit 30 performs very poorly. Analog circuitry can be particularly affected by extremes in temperature.

In one embodiment, upon turning on the wireless electronic device 40, the temperature controller 34 activates the heating element 36 to begin heating the active circuit 30 so that it may turn on or function properly. In alternative embodiments the heating element 36 is utilized to heat display circuitry 44, antenna circuit 42, signal processing circuitry, I/O circuitry, processing circuitry, control circuitry, memory circuitry 38, or any other circuitry in the wireless electronic device 40. In other words the active circuit 30 may take the form of any of the circuitry mentioned above or any other circuitry that benefits from use of the heating element 36 in any way. The blocks used in FIGS. 2 and 3 are merely exemplary and may be combined or utilized in any suitable configuration.

Once the desired circuitry has been sufficiently heated, the temperature sensor 32, the temperature controller 34, and the heating element 36 can be utilized to maintain the temperature of the active circuit 30 as described in relation to FIG. 2.

While the embodiment illustrated in FIG. 3 is a wireless electronic device 40, other embodiments include any kind of electronic device, wireless or otherwise, that may benefit from the heating process described in relation to FIG. 2.

Figure 4:
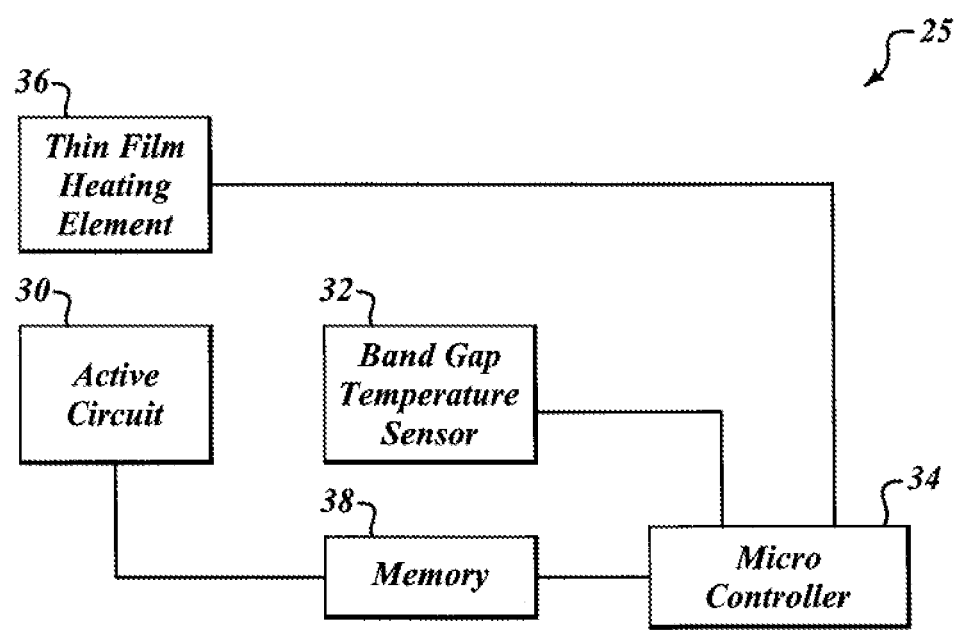
FIG. 4 is a block diagram of a system for maintaining a stable temperature of an active circuit according to one embodiment.

FIG. 4 illustrates a block diagram of a system 25 according to one embodiment. A band gap temperature sensor 32 monitors the temperature of the active circuit 30. The band gap of a semiconductor substrate 48 varies slightly with temperature. Thus the temperature of the semiconductor substrate 48 can be measured by measuring (directly or indirectly) the band gap. The band gap temperature sensor 32 is positioned adjacent to the active circuit 30 so as to be able to generate a temperature signal that is representative of the temperature of the active circuit 30. In one embodiment the band gap temperature sensor 32 is a Brokaw band gap temperature sensor 32, but any suitable band gap sensor may be used.

The band gap temperature sensor 32 is coupled to a microcontroller 34, acting as temperature controller. The microcontroller 34 receives a temperature signal from the band gap temperature sensor 32. The temperature signal is representative of the temperature of the active circuit 30. The microcontroller 34 is coupled to a thin film heating element 36. The thin film heating element 36 generates heat when an electric current is sent through it. The larger the current in the thin film heating element 36, the larger the heat output from the thin film heating element 36. The thin film heating element 36 is a thin film of any suitable material that heats up as current goes through it. Heat energy from the thin film heating element 36 diffuses and heats up the active circuit 30. The active circuit 30 and the thin film heating element 36 are arranged so that the thin film heating element 36 may affect the temperature of the active circuit 30. In one embodiment the thin film heating element 36 is a TaAl thin film heating element 36.

The microcontroller 34 is configured to control the amount of current in the thin film heating element 36. By controlling the amount of current in the thin film heating element 36 the microcontroller 34 controls the heat output of the thin film heating element 36. As the microcontroller 34 receives temperature signals from the band gap temperature sensor 32, the microcontroller 34 varies the current in the thin film heating element 36 to control the heat output from the thin film heating element 36 and to maintain the temperature of the active circuit 30 in a selected range as described in relation to FIG. 2.

Figure 5:
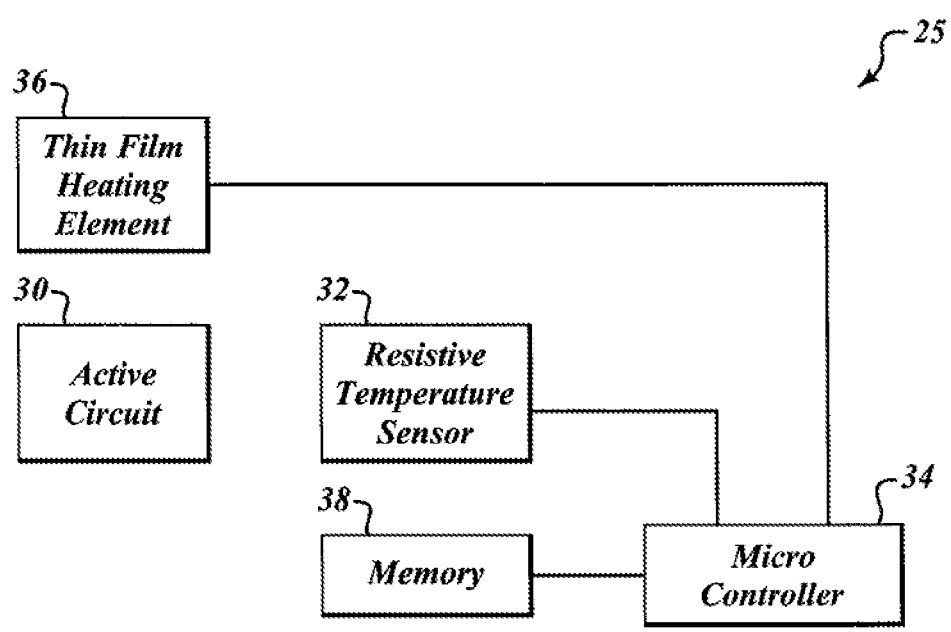
FIG. 5 is a block diagram of a system for maintaining a stable temperature of an active circuit according to one embodiment.

FIG. 5 illustrates one embodiment in which the temperature sensor 32 is implemented as a resistive temperature sensor 32. The resistive temperature sensor 32 is implemented in a material whose resistance changes with temperature. The temperature of the resistive temperature sensor 32 is determined by a measurement of its resistance. The resistive temperature sensor 32 is positioned relative to the active circuit 30 such that a measurement of the temperature of the resistive temperature sensor 32 is indicative of the temperature of the active circuit 30. In one embodiment, the temperature of the active circuit 30 is extrapolated from a measurement of the resistance of the resistive temperature sensor 32. In one embodiment the resistive temperature sensor 32 is a thin film resistor whose resistance varies with the temperature. In one embodiment the resistive temperature sensor 32 is a thin film resistor made from CrSi.

Figure 6:
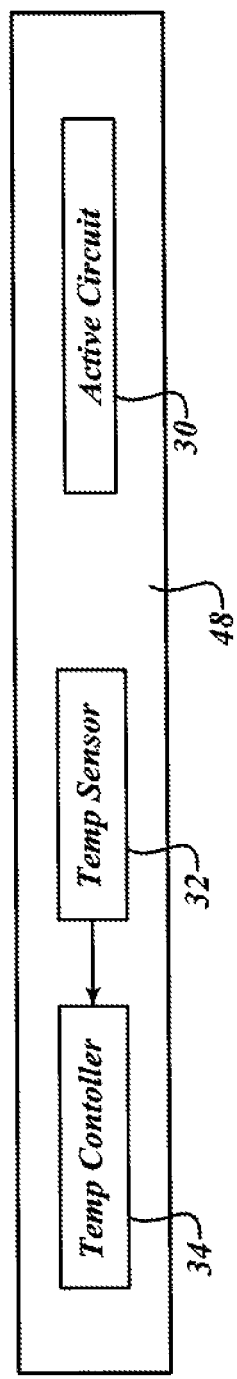
FIGS. 6-10 illustrate successive process steps for manufacturing an integrated circuit according to one embodiment.

FIGS. 6-10 illustrate a simplified process for manufacturing an integrated circuit according to one embodiment. In FIG. 6 an active circuit 30, a band gap temperature sensor 32, and a temperature controller 34 have been formed in a semiconductor substrate 48. As shown in FIG. 6, the band gap temperature sensor 32 is located in the semiconductor substrate 48 near the active circuit 30. In one embodiment the band gap temperature sensor 32 and/or the temperature controller 34 are formed as part of the active circuit 30. Many other configurations of the active circuit 30, the temperature controller 34, and the band gap temperature sensor 32 are also possible as will be readily apparent to those of skill in the art in light of the present disclosure.

Figure 7:
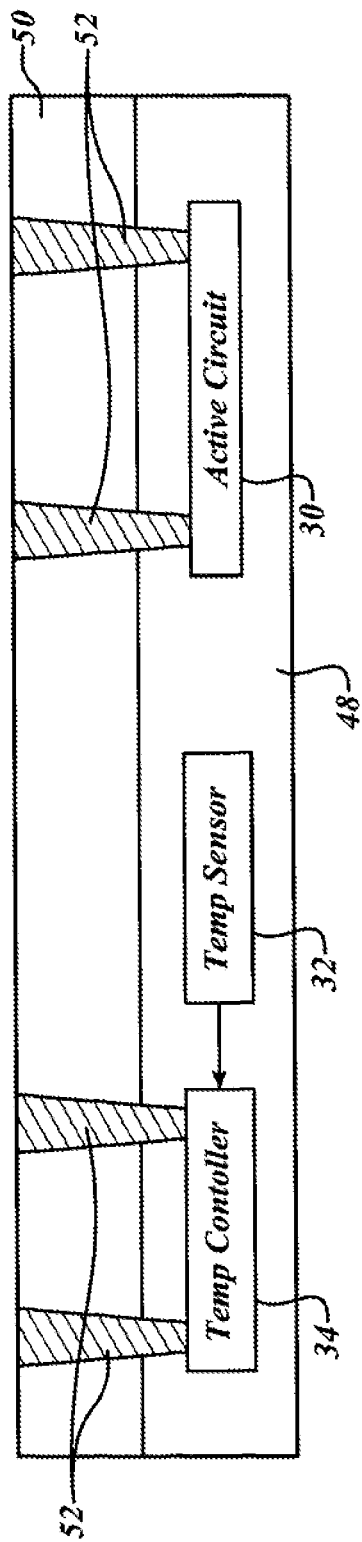
Figure 8:
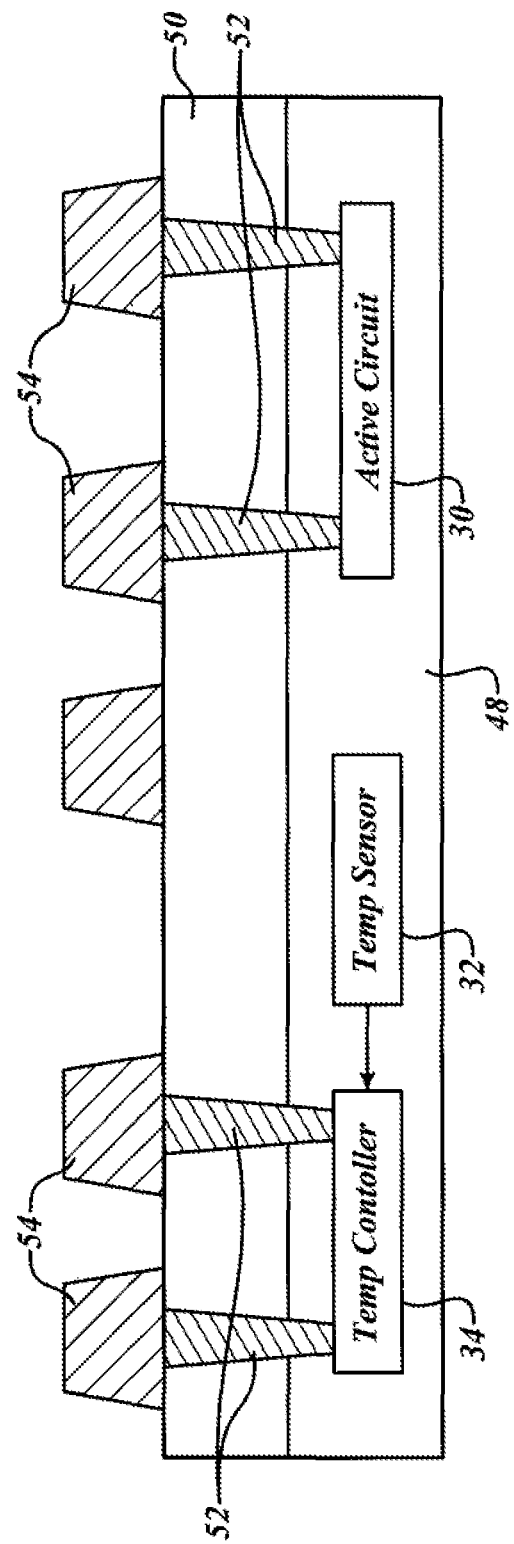
Figure 9:
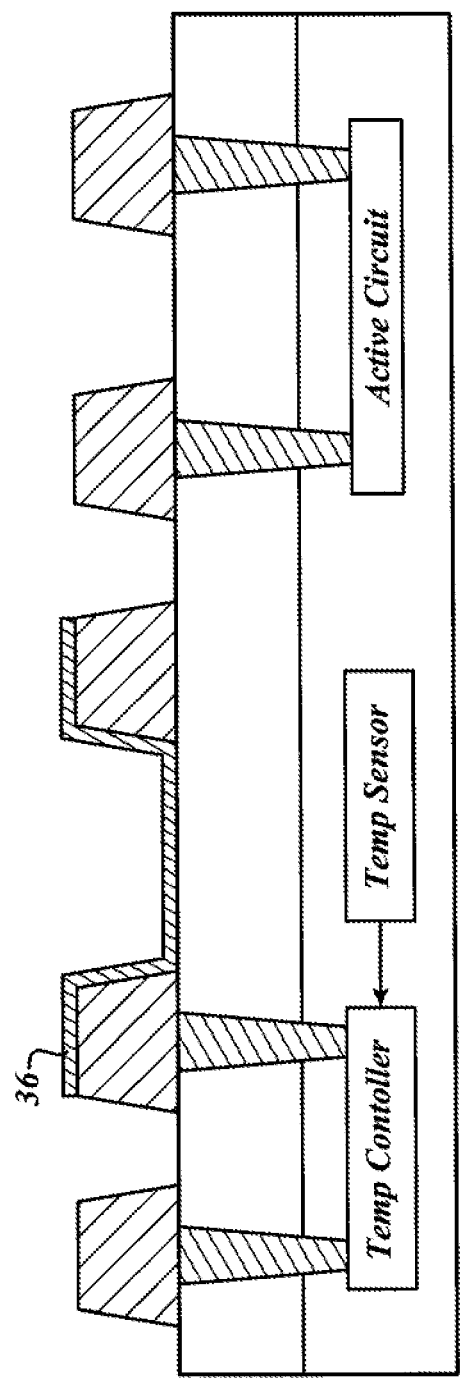

In FIG. 7 a pre-metal dielectric layer 50, for example a silicon nitride or silicon oxide layer, is deposited on the substrate 48. Contacts 52 to the active device and the temperature controller 34 are etched and filled. In FIG. 8 metal lines 54 are formed overlaying the contacts 52. In FIG. 9 the TaAl thin film heating element 36 is formed between two metal lines 54. The thin film heating element 36 is connected by one of the metal lines 54 to the temperature controller 34. The temperature controller 34 controls the amount of current that passes through the thin film heating element 36.

Figure 10:
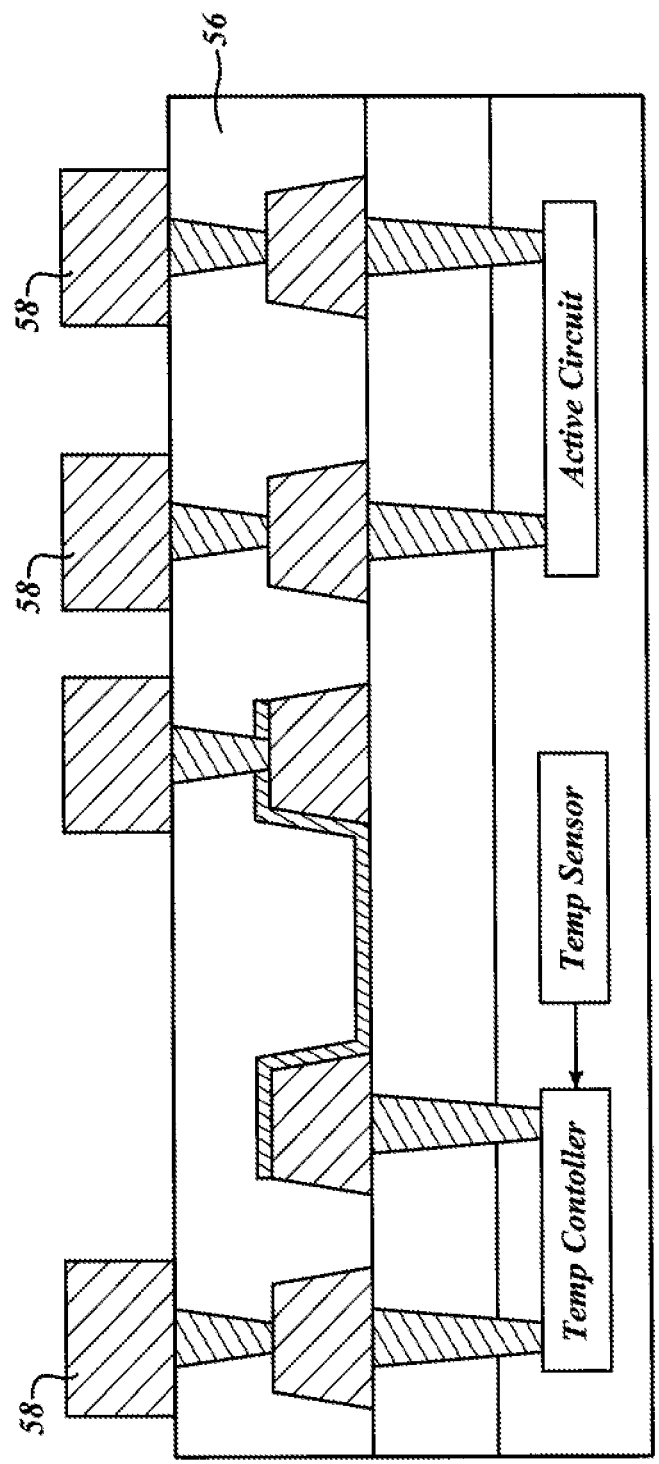

In FIG. 10 a second dielectric layer 56, for example a silicon oxide or a silicon nitride layer, has been deposited over the thin film heating element 36 and the metal lines 54. Second contacts 57 are made in the second dielectric layer 56 and filled. Second metal lines 58 are made overlying the second dielectric layer 56 and second contacts 57. The integrated circuit is then passivated and packaged (not shown). It is understood by those of skill in the art that many process steps and structures have not been illustrated in FIGS. 6-10 for the sake of simplicity. Such steps and structures are known by those of skill in the art and can now readily be integrated with embodiments in light of the present disclosure. All such structures and steps fall within the scope of the present disclosure.

Figure 11:
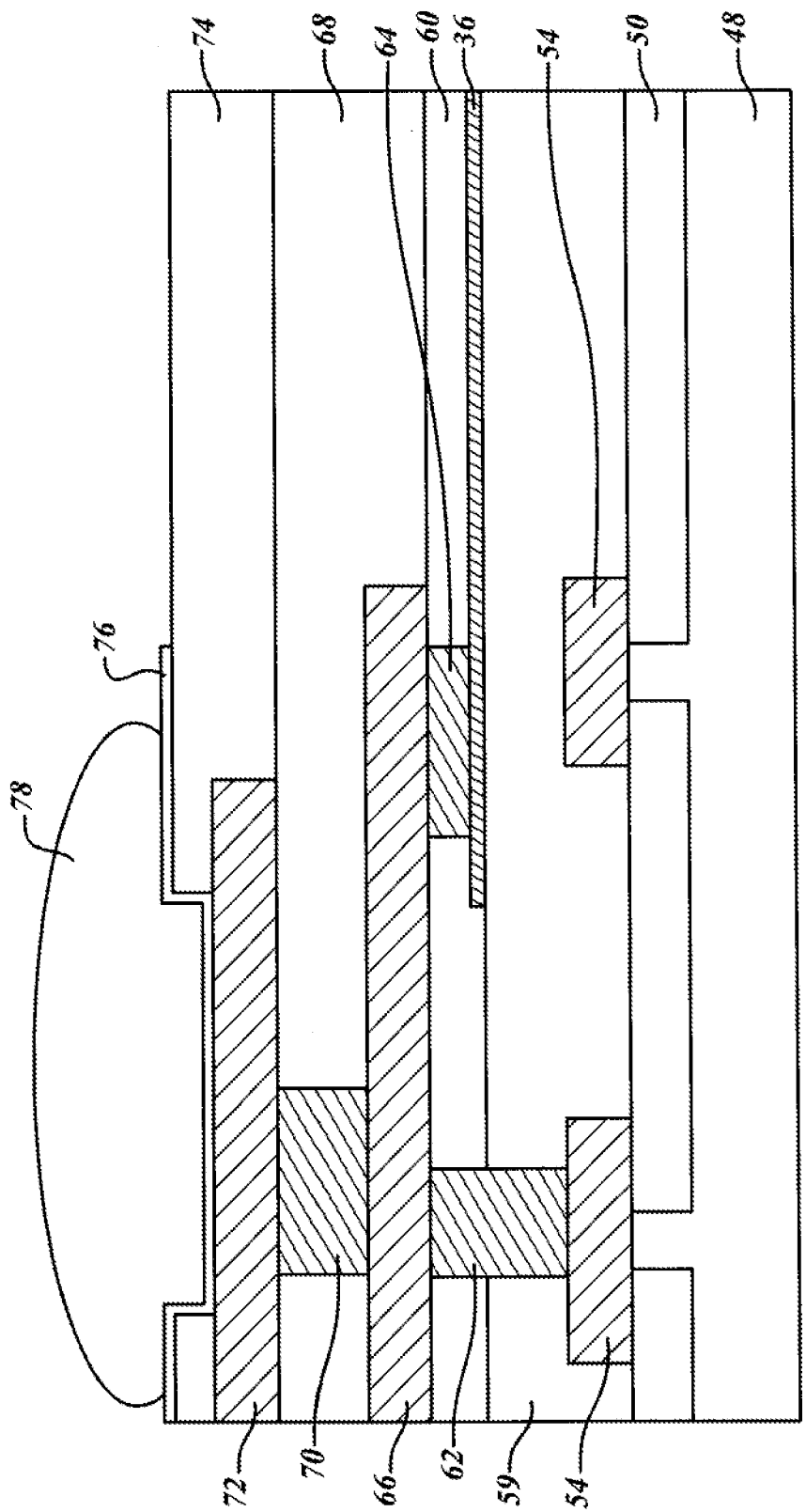
FIG. 11 illustrates an integrated circuit according to one embodiment.

FIG. 11 illustrates an integrated circuit containing a thin film heating element 36 according to an alternate embodiment. The process steps are not illustrated and the structures are simplified. On a semiconductor substrate 48, a pre-metal dielectric layer 50 is deposited. The height of the pre-metal dielectric layer 50 is for example 8 kÅ (kilo Angstroms). First metal conducting lines 54 are deposited on the pre-metal dielectric 50. A first inter-level dielectric layer 59 is deposited on the pre-metal dielectric 50. The height of the first inter-level dielectric layer 59 is for example 5 kÅ. The TaAl thin film heating element 36 is deposited on the first inter-level dielectric layer 59. A second inter-level dielectric layer 60 is deposited on the first inter-level dielectric layer 59 and the thin film heating element 36. The height of the second inter-level dielectric layer 60 is for example 5 kÅ. A first contact via 62 is made through the first and second inter-level dielectric layers 59, 60 to one of the first metal lines 54. A second contact via 64 is made through the second inter-level dielectric layer 60 to the thin film heating element 36. The first contact via 62 and the second contact via 64 are filled with conductive material. A second metal track 66 is formed on the second inter-level dielectric layer 60. A third inter-level dielectric layer 68 is formed on the second inter-level dielectric layer 60 and the second metal track 66. The height of the third inter-level dielectric is for example 5 kÅ. A third contact via 70 is made through the third inter-level dielectric layer 68 to the second metal track 66 and filled. A third metal track 72 is deposited on the third inter-level dielectric layer 68. A passivation layer 74 is formed on the third inter-level dielectric layer 68 and third metal track 72. The height of the passivation layer 74 is for example 10 kÅ. A portion of the passivation layer 74 is etched to expose a portion of the third metal track 72. A conductive barrier layer 76 is deposited over the exposed portion of the third metal track 72 and a solder ball 78 is placed on the conductive barrier 76.

An example of relative temperatures in the integrated circuit according to one embodiment will now be described. In one embodiment it is desirable to keep the temperature of the active circuit 30 between 50° C. and 55° C. in order to stabilize output parameters of the active circuit 30. The active circuit 30 is not shown in FIG. 11, but is located in the substrate 48 below the thin film heating element 36. In other embodiments the active circuit 30 is located in other positions relative to the heating element 36.

In this example the ambient temperature outside of the integrated circuit is 20° C. The microcontroller 34 (also not shown in FIG. 11, but located within the silicon substrate 48) sends a current through the thin film heating element 36 such that the temperature of the thin film heating element 36 is 200° C. Heat from the thin film heating element 36 diffuses throughout the integrated circuit. Areas further from the heating element 36 will be heated less than areas closer to the heating element 36. The temperature at the junction of the pre-metal dielectric layer 50 and the first inter-level dielectric layer 59 is for example 100° C. The temperature of the active circuit in the silicon substrate 48 is for example 50° C. The temperature sensor 32 detects this temperature and sends a temperature signal to the temperature controller 34 which calculates an amount of current to send through the heating element 36 according to the temperature data. In this way the temperature of the active circuit 30 can be maintained between 50° C. and 55° C. In practice the relative temperatures of the heating element 36, the dielectric layers, and the active circuit 30 may be very different from this example and will depend on the structure of the integrated circuit, the relative placement of the integrated circuit, the materials used in the integrated circuit, and so forth. All of these parameters can be taken into account when manufacturing an integrated circuit and tests can also be run in order to determine how the temperature of the active circuit 30 will respond to the temperature of the heating element 36.

Figure 12:
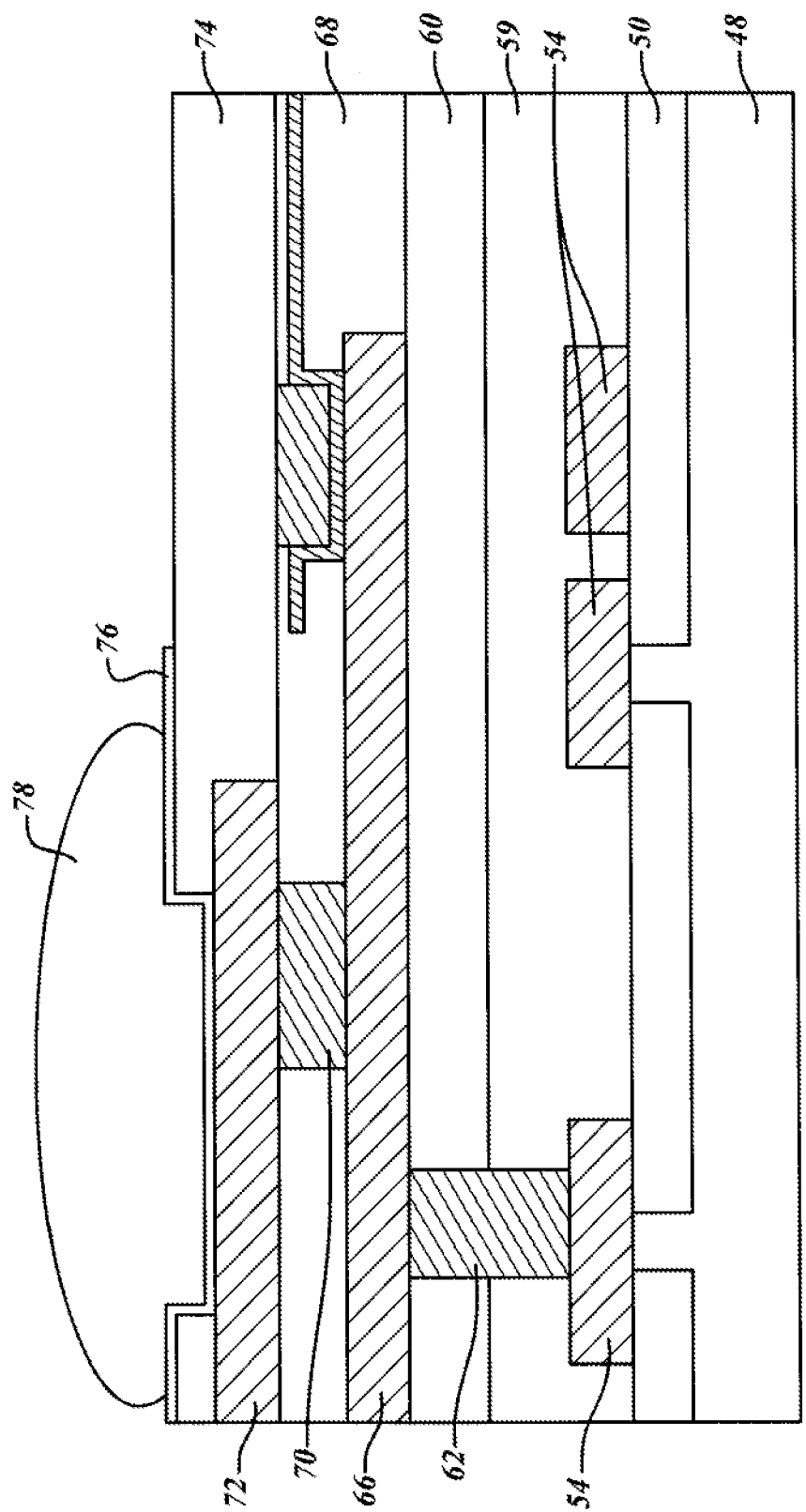
FIG. 12 illustrates an integrated circuit according to one embodiment.

FIG. 12 illustrates an integrated circuit containing the thin film heating element 36 according to one embodiment. Features similar to those of FIG. 11 receive the same reference numbers. On a semiconductor substrate 48, a pre-metal dielectric layer 50 is deposited. The height of the pre-metal dielectric layer 50 is for example 8 kÅ. First metal conducting lines 54 are deposited on the pre-metal dielectric layer 50. A first inter-level dielectric layer 59 is deposited on the pre-metal dielectric layer 50. The height of the first inter-level dielectric layer 59 is for example 5 kÅ. A second inter-level dielectric layer 60 is deposited on the first inter-level dielectric layer 59. The height of the second inter-level dielectric layer 60 is for example 5 kÅ. A first contact via 62 is made through the first and second inter-level dielectric layers 59, 60 to one of the first metal lines 54 and filled. A second metal track 66 is formed on the second inter-level dielectric layer 60. A third inter-level dielectric 68 is formed on the second inter-level dielectric layer 60 and the second metal track 66. The height of the third inter-level dielectric layer 68 is for example 5 kÅ. A second contact via 70 is made through the third inter-level dielectric layer 68 to a first portion of the second metal track 66 and filled. A third contact via 64 is made through the third inter-level dielectric layer 68 to the second metal track 66 and filled. The TaAl thin film heating element 36 is formed in the third inter-level dielectric layer 68 with a portion of the thin film heating element 36 contacting the exposed second portion of the second metal track 66 to make an electrical connection between the thin film heating element 36 and the second metal track 66. A third metal track 72 is deposited on the third inter-level dielectric layer 68. A passivation layer 74 is deposited on the third inter-level dielectric layer 68 and third metal track 72. The height of the third inter-level dielectric layer 68 is for example 10 kÅ. A portion of the passivation layer 74 is etched to expose a portion of the third metal track 72. A conductive barrier layer 76 is deposited over the exposed portion of the third metal track 72 and a solder ball 78 is placed on the conductive barrier 76.

Figure 13:
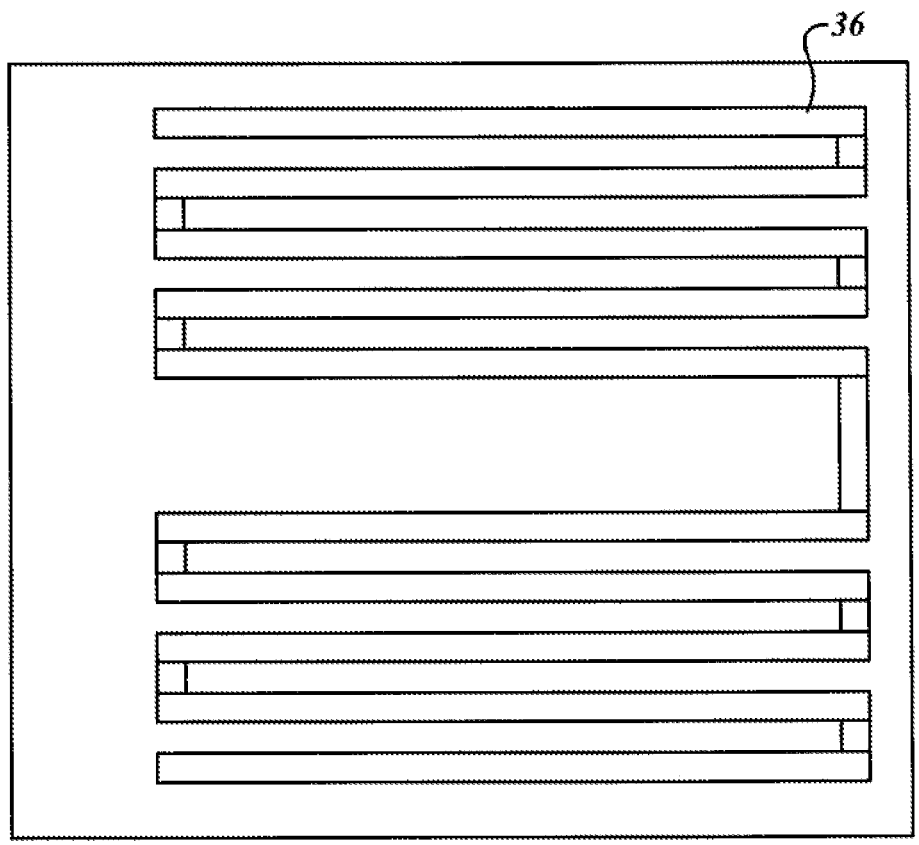
FIG. 13 is a layout for a thin film heating element according to one embodiment.

FIG. 13 is top view of the layout of a TaAl thin film heating element 36 according to one embodiment. Because the dimensions of features on an integrated circuit are typically very small, it is often advantageous to implement a snake-like configuration for a resistor in an integrated circuit. The many connected segments increase the length of the resistor and thus allow the resistor to achieve a desired level of resistance. In one embodiment the thickness of the TaAl thin film heating element 36 is about 200 nm. In one embodiment the sheet resistance of the TaAl thin film heating element 36 is 10-100 Ω/sq. In one embodiment the resistance of the TaAl thin film heating element 36 is 120Ω. The resistance of the TaAl thin film heating element 36 can be more or less than this depending on the needs of any particular device. Of course, any other suitable material may be used in place of TaAl to implement the thin film heating element 36.

Figure 14:
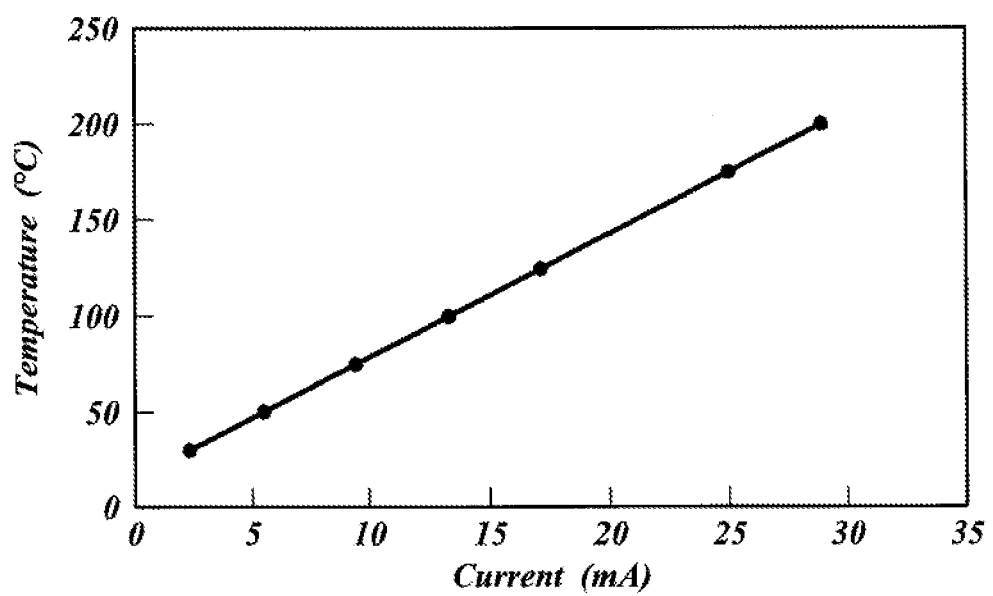
FIG. 14 plots the temperature of a thin film heating element vs. the current in the heating element.

FIG. 14 is a plot of the simulated temperature of the thin film heating element 36 as a function of the current through the device. As described above, in one embodiment the temperature controller 34 varies the magnitude of the current in the thin film heating element 36 in order to generate more or less heat as needed to control the temperature of the active circuit 30. In one embodiment the temperature of the thin film heating element 36 is about 200° C. when the current in the thin film heating element 36 is about 30 mA. The temperature of the active circuit 30 will depend in part on the temperature of the heating element 36 and the position of the heating element 36 in relation to the active circuit 30.

In one embodiment the active circuit 30 is implemented in a first semiconductor die 80 and the heating element 36 is implemented in a second semiconductor die 82. In extremely cold temperatures some integrated circuits function poorly or are unable to turn on at all. In this configuration the second semiconductor die 82 can act as an ignition die for the active circuit 30 on the first semiconductor die 80. In cold temperatures, the heating element 36 on the second semiconductor die 82 is first activated to heat the active circuit 30 to a desired temperature. When the active circuit 30 is sufficiently heated it may then turn on and function properly. The heating element 36 is then used to perform the function of heating the active circuit 30 to maintain the temperature of the active circuit 30 in a selected temperature range.

Figure 15:
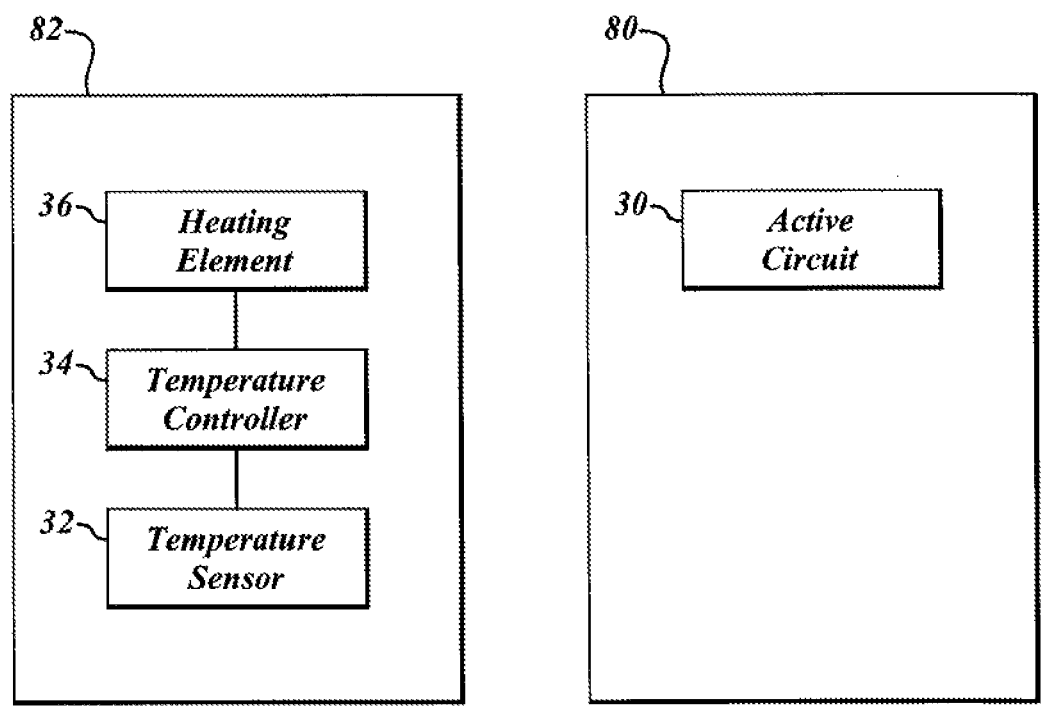
FIG. 15 is a block diagram of a system for heating an integrated circuit according to one embodiment.

FIG. 15 is a block diagram of an embodiment in which the active circuit 30 is located on a first semiconductor die 80 and the heating element 36 is located on a second semiconductor die 82. In the embodiment of FIG. 15 the heating element 36, the temperature sensor 32, and the temperature controller 34 are all located on the second semiconductor die 82. The second semiconductor die 82 is coupled to the first semiconductor die 80 in such a way that heat from the heating element 36 can diffuse and heat the active circuit 30 in the first semiconductor die 80. The temperature sensor 32 is positioned relative to the heating element 36 and the first semiconductor die 80 such that the temperature of the active circuit 30 can be extrapolated from the temperature measured by the temperature sensor 32. In one embodiment the temperature sensor 32 is much closer to the heating element 36 than to the active circuit 30. In this case the temperature of the active circuit 30 may be much less than the temperature measured by the temperature sensor 32. As described above in relation to the exemplary temperature data presented in relation to FIG. 11, by measurement and calculation the relation between the temperature at the position of the temperature sensor 32 in the second semiconductor die 82 and the active circuit 30 in the first semiconductor die 80 can be known. This relation can be stored in memory 38 or otherwise made available to the temperature controller 34. The temperature controller 34 can then accurately control the heating element 36 to heat the active circuit 30 to maintain the temperature of the active circuit 30 in the selected temperature range.

Figure 16:
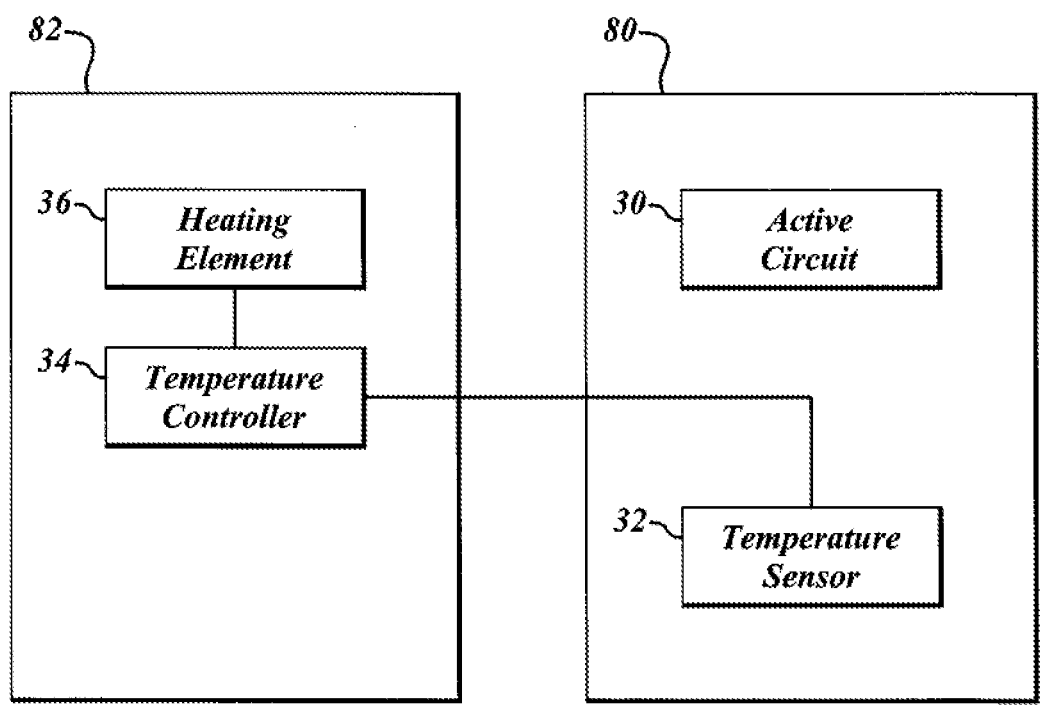
FIG. 16 is a block diagram of a system for heating an integrated circuit according to one embodiment.

In the embodiment of FIG. 16 the temperature sensor 32 is located on the first semiconductor die 80 with the active circuit 30. The heating element 36 and temperature controller 34 are located on the second semiconductor die 82. The temperature sensor 32 is electrically coupled to the temperature controller 34. The temperature controller 34 is located on the second semiconductor die 82 and controls the temperature of the heating element 36 according to temperature signals received from the temperature sensor 32.

Figure 17:
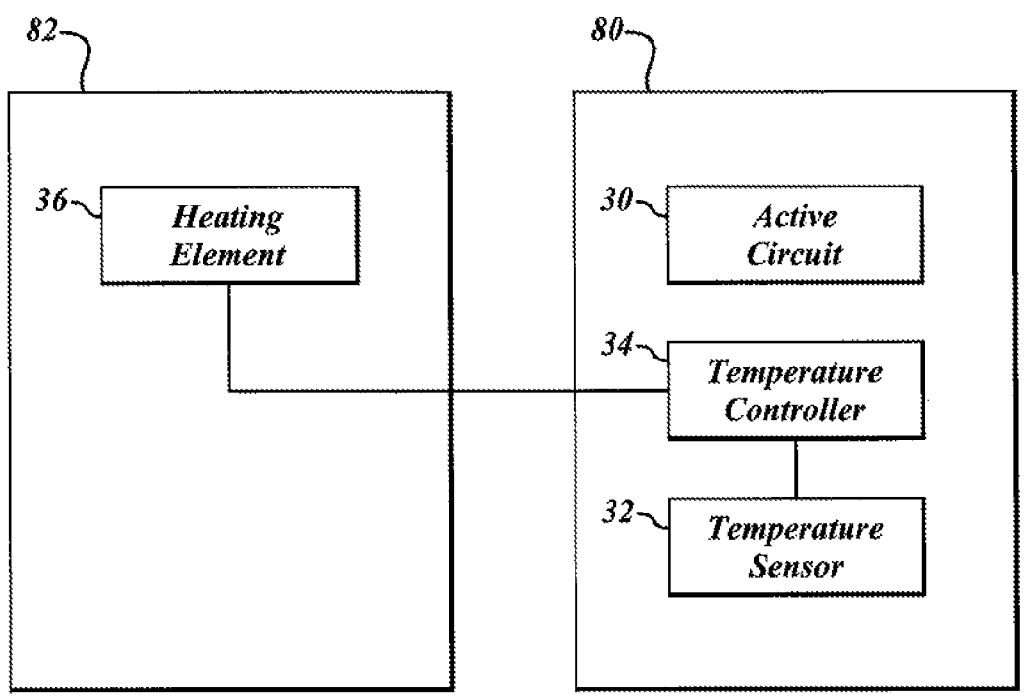
FIG. 17 is a block diagram of a system for heating an integrated circuit according to one embodiment.

In the embodiment of FIG. 17 the temperature sensor 32, the temperature controller 34, and the active circuit 30 are all located on the first semiconductor die 80. The heating element 36 is located on the second semiconductor die 82. The heating element 36 is electrically connected to the temperature controller 34 so that the temperature controller 34 can control an operation of the heating element 36.

FIGS. 18-21 illustrate exemplary configurations in which the second semiconductor die 82 is coupled to the first semiconductor die 80. In one embodiment the first and the second semiconductor dies 80, 82 are separately passivated after manufacture and then attached to each other. The two dies are then attached to a circuit board 84.

Figure 18:
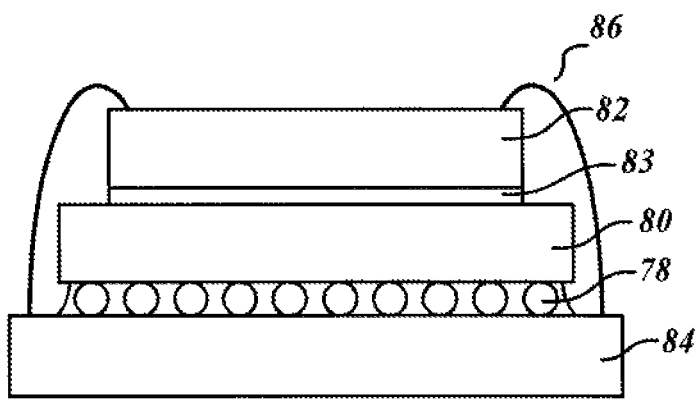
FIG. 18 illustrates a two-die configuration of a system for heating an integrated circuit according to one embodiment.

In FIG. 18 the second semiconductor die 82 is attached to the first semiconductor die 80 by an adhesive layer 83. The second semiconductor die 82 is electrically connected to bonding pads (not shown) on the circuit board 84 by means of bonding wires 86. The first semiconductor die 80 is coupled to the circuit board 84 by solder balls 78.

Figure 19:
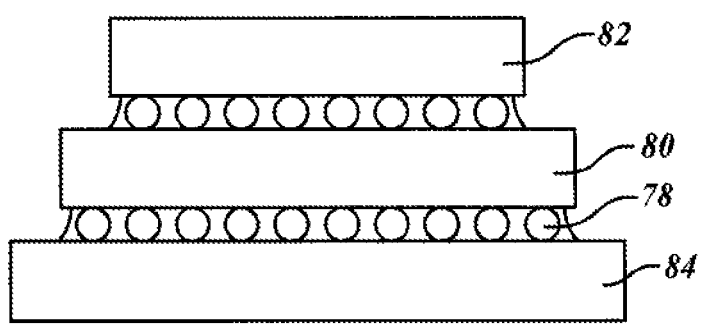
FIG. 19 illustrates a two-die configuration of a system for heating an integrated circuit according to one embodiment.

In FIG. 19 the second semiconductor die 82 is coupled to the first semiconductor die 80 by solder bumps 88. The solder bumps 88 can provide an electrical connection between the first semiconductor die 80 and the second semiconductor die 82 so that components on the first semiconductor die 80 can communicate with components on the second semiconductor die 82. The solder bumps 88 can also function to improve heat transfer from the second semiconductor die 82 to the first semiconductor die 80. The second semiconductor die 82 is coupled to the circuit board 84 by solder balls 78.

Figure 20:
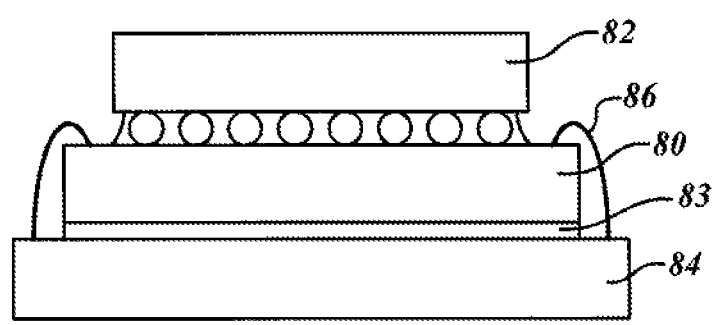
FIG. 20 illustrates a two-die configuration of a system for heating an integrated circuit according to one embodiment.

In FIG. 20 the second semiconductor die 82 is coupled to the first semiconductor die 80 by solder bumps 88. The solder bumps 88 can provide an electrical connection between the first semiconductor die 80 and the second semiconductor die 82 so that components on the first semiconductor die 80 can communicate with components on the second semiconductor die 82. The first semiconductor die 80 is coupled to the circuit board 84 by an adhesive layer 83. The first semiconductor die 80 is electrically connected to the circuit board 84 by bonding wires 86.

Figure 21:
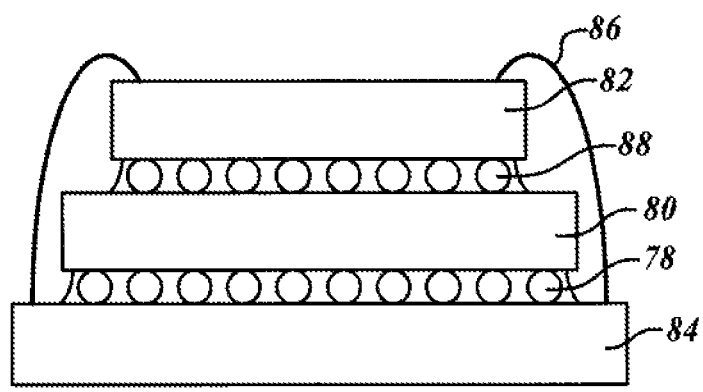
FIG. 21 illustrates a two-die configuration of a system for heating an integrated circuit according to one embodiment.

In FIG. 21 the second semiconductor die 82 is coupled to the first semiconductor die 80 by solder bumps 88. The solder bumps 88 can provide an electrical connection between the first semiconductor die 80 and the second semiconductor die 82 so that components on the first semiconductor die 80 can communicate with components on the second semiconductor die 82. The solder bumps 88 can also function to improve heat transfer from the second semiconductor die 82 to the first semiconductor die 80. The second semiconductor die 82 is coupled to the circuit board 84 by solder balls 78. The second semiconductor die 82 is electrically connected to the circuit board 84 by bonding wires 86.

In one embodiment the temperature sensor 32 is a resistive temperature sensor 32 located on the second semiconductor die 82. The resistance of the resistive temperature sensor 32 is temperature dependent. The resistance of the resistive temperature sensor 32 is representative of the temperature of the resistive temperature sensor 32. The temperature of the resistive temperature sensor 32 is representative of the temperature of the active circuit 30 according to a relationship which can be calculated and measured as described above.

In one embodiment the resistive temperature sensor 32 is a thin film resistor made of CrSi. In one embodiment the resistance of the CrSi resistive temperature sensor 32 varies by 4000 ppm/C. In other words the resistance changes by 0.004% for a change in temperature of 1° C. By knowing the resistance at a given temperature (which can be obtained by prior measurement), the temperature of the resistive temperature sensor 32 can be calculated based on its resistance. In one embodiment the voltage across the resistive temperature sensor is indicative of the temperature of the active circuit 30.

Figure 22:
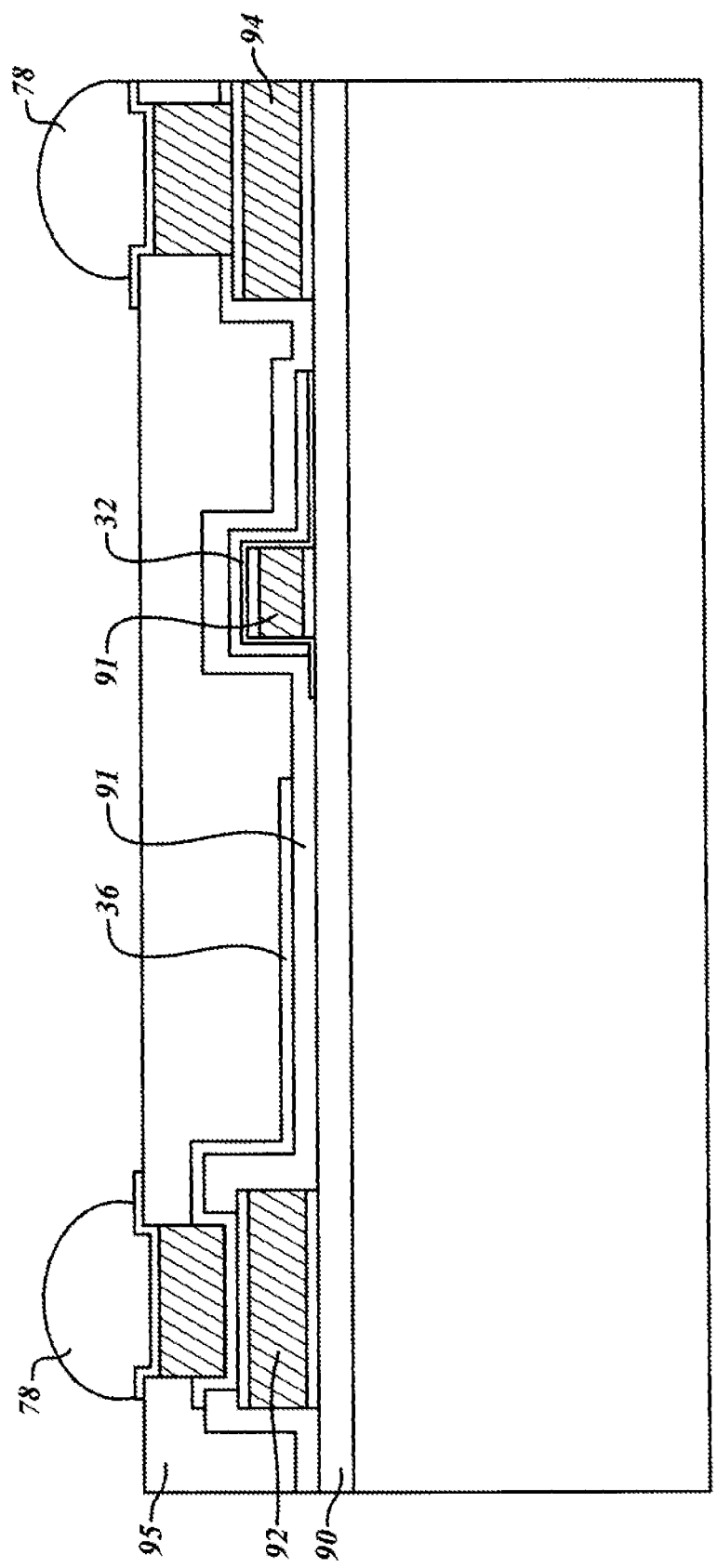
FIG. 22 illustrates an integrated circuit according to one embodiment.

FIG. 22 illustrates an embodiment in which the heating element 36 and the resistive temperature sensor 32 are implemented on the second semiconductor die 82. The lower layers of the dielectric stack and the lower metal layers are not illustrated. A first metal track 92, a second metal track 93, and a third metal track 94 are shown on a first dielectric layer 90 of $Si_3N_4$. A CrSi resistive temperature sensor 32 is then formed on the second metal track 93. A second dielectric layer 91 of $Si_3N_4$ is then deposited on the first dielectric layer 90 of $Si_3N_4$, the resistive temperature sensor 32, the first metal track 92 and the third metal track 94. The second dielectric layer 91 is etched to expose the first metal track 92. A TaAl thin film heating element 36 is deposited on the second dielectric layer 91 and the exposed portion of the first metal track 92. A third dielectric layer 95 of $SiO_2$ is then deposited over the heating element 36 and the second dielectric layer 91. The third dielectric layer 95 is then etched to expose a portion of the heating element 36 and the third metal track 94. Plugs fill the etched portions and solder bumps 88 are attached to the plugs.

Figure 23:
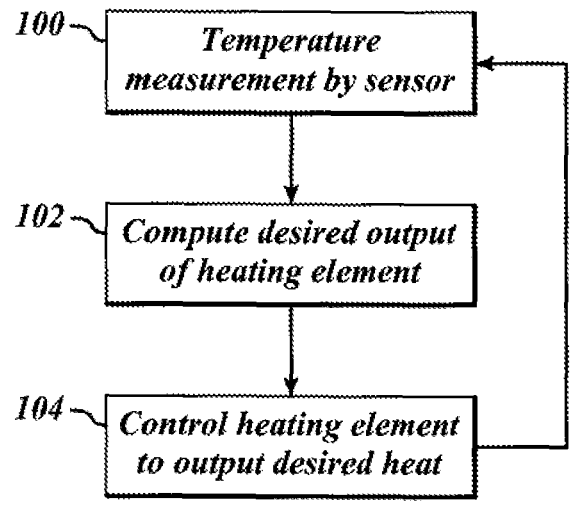
FIG. 23 illustrates steps of a method for controlling the temperature of an integrated circuit according to one embodiment.

FIG. 23 illustrates a method according to one embodiment. At 100, the temperature sensor 32 measures the temperature of the active circuit 30. At 102 the temperature controller 34 receives a temperature signal from the temperature sensor 32 and computes the output of the heating element 36 that should be applied. At 104 the temperature controller 34 controls heating element 36 to output the desired heat to maintain the temperature of the active circuit 30 above a selected minimum temperature or in a selected temperature range. Steps 100-104 are repeated throughout any period during which it is desired to maintain the temperature of the active circuit 30 in the selected temperature range.

Figure 24:
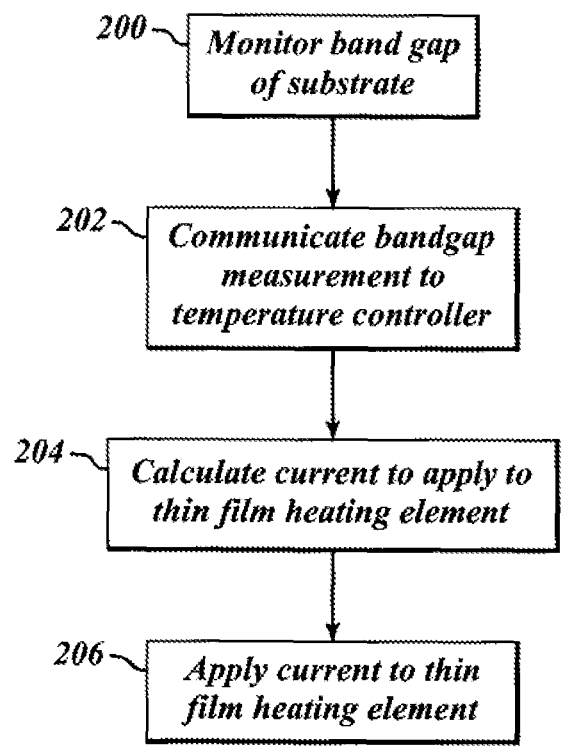
FIG. 24 illustrates steps of a method for controlling the temperature of an integrated circuit according to one embodiment.

FIG. 24 illustrates a method according to one embodiment. At 200 a bandgap temperature sensor 32 monitors the temperature of the active circuit 30. At 202 the bandgap temperature sensor 32 communicates to the temperature controller 34 a temperature signal representative of the temperature of the active circuit 30. At 204 the temperature controller 34 calculates an amount of current to apply to a thin film heating element 36 according to the temperature signal in order to maintain the temperature of the active circuit 30 in a selected temperature range. At 206 the temperature controller 34 sends a current through a thin film heating element 36 to generate heat to heat the active circuit 30 to maintain the temperature of the active circuit 30 in the selected temperature range.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a first semiconductor die;
   an active circuit in the first semiconductor die;
   a temperature sensor configured to measure a temperature of the active circuit;
   a second semiconductor die coupled to the first semiconductor die;
   a heating element on the second semiconductor die, the heating element configured to heat the active circuit of the first semiconductor die; and a temperature controller configured to receive temperature data from the temperature sensor and data regarding a level of use of the active circuit from the active circuit, to operate the heating element according to the temperature data and the level of use of the active circuit, and to cause the heating element to heat the active circuit to maintain the temperature of the active circuit above a minimum threshold temperature and below a maximum threshold temperature.

2. The device of claim 1 wherein the temperature controller is in the second semiconductor die.

3. The device of claim 1 wherein the temperature controller is in the first semiconductor die.

4. The device of claim 1 wherein the temperature controller regulates a current in the heating element to generate heat to maintain the temperature of the active circuit above the minimum threshold temperature and below the maximum threshold temperature.

5. The device of claim 1 wherein the temperature sensor is on the second semiconductor die.

6. The device of claim 1 wherein the temperature sensor is on the first semiconductor die.

7. The device of claim 1 wherein the temperature sensor is a thin film resistor whose resistance varies with temperature.

8. The device of claim 1 wherein the temperature sensor and the temperature controller are in the second semiconductor die.

9. The device of claim 1 wherein the temperature sensor and the temperature controller are in the first semiconductor die.

10. The device of claim 1 wherein the heating element is a thin film heating element.

11. The device of claim 10 wherein the heating element is TaAl.

12. The device of claim 10 comprising a multilayer dielectric stack on a surface of the second semiconductor die, the thin film heating element being located in the multilayer dielectric stack.

13. The device of claim 12 wherein the heating element is located above the active circuit.

14. The device of claim 1 wherein the heating element is a single heating element with a variable heat output.

15. The device of claim 1 wherein the heating element is a plurality of heating elements, and the temperature controller selectively enables a number of the heating elements based on the temperature data.

16. A device comprising:
a first semiconductor die;
an active circuit in the first semiconductor die;
a temperature sensor configured to measure a temperature of the active circuit;
a second semiconductor die coupled to the first semiconductor die;
a heating element on the second semiconductor die, the heating element configured to heat the active circuit of the first semiconductor die;
a temperature controller configured to receive temperature data from the temperature sensor and data regarding a level of use of the active circuit from the active circuit, to operate the heating element according to the temperature data and the level of use of the active circuit, and to cause the heating element to heat the active circuit to maintain the temperature of the active circuit above a minimum threshold temperature and below a maximum threshold temperature; and
a multilayer dielectric stack on a surface of the second semiconductor die, the heating element being located in the multilayer dielectric stack.

17. The device of claim 16 wherein the heating element is a thin-film heating element.

18. A device comprising:
a first semiconductor die;
an active circuit in the first semiconductor die;
a temperature sensor configured to measure a temperature of the active circuit;
a second semiconductor die coupled to the first semiconductor die;
a plurality of heating elements on the second semiconductor die, the heating elements configured to heat the active circuit of the first semiconductor die; and
a temperature controller configured to receive temperature data from the temperature sensor and data regarding a level of use of the active circuit from the active circuit, to operate the heating element according to the temperature data and the level of use of the active circuit, and to selectively enable a number of the heating elements based on the temperature data.

19. The device of claim 18 wherein the heating element is a thin-film heating element.

20. The device of claim 19 wherein the temperature sensor is a thin film resistor whose resistance varies with temperature.

* * * * *